US006906971B2

(12) United States Patent
Nakamura et al.

(10) Patent No.: US 6,906,971 B2
(45) Date of Patent: Jun. 14, 2005

(54) SEMICONDUCTOR INTEGRATED CIRCUIT DEVICE

(75) Inventors: Masayuki Nakamura, Nagoya (JP); Kazuyuki Miyazawa, Hidaka (JP); Hidetoshi Iwai, Ohme (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/767,078

(22) Filed: Jan. 30, 2004

(65) Prior Publication Data

US 2004/0184330 A1 Sep. 23, 2004

Related U.S. Application Data

(63) Continuation of application No. 10/091,064, filed on Mar. 6, 2002, now abandoned, which is a division of application No. 09/572,906, filed on May 17, 2000, now abandoned, which is a continuation of application No. 08/823,167, filed on Mar. 25, 1997, now Pat. No. 6,078,084, which is a continuation of application No. 08/476,761, filed on Jun. 7, 1995, now Pat. No. 5,654,577.

(30) Foreign Application Priority Data

Jun. 28, 1994 (JP) .............................................. 6-169050

(51) Int. Cl.[7] ................................................. G11C 7/00
(52) U.S. Cl. .................... 365/201; 365/226; 365/189.09
(58) Field of Search ................................. 365/201, 226, 365/189.09, 185.23

(56) References Cited

U.S. PATENT DOCUMENTS

| | | | | |
|---|---|---|---|---|
| 4,751,679 A | | 6/1988 | Dehganpour ................. 365/201 |
| 5,079,613 A | | 1/1992 | Sawada et al. ............... 257/409 |
| 5,148,255 A | | 9/1992 | Nakazato et al. ............. 257/378 |
| 5,212,442 A | * | 5/1993 | O'Toole et al. .............. 324/73.1 |
| 5,386,135 A | | 1/1995 | Nakazato et al. ............. 257/369 |
| 5,619,459 A | | 4/1997 | Gilliam ....................... 365/201 |
| 5,654,577 A | | 8/1997 | Nakamura et al. ........... 257/392 |
| 5,905,682 A | | 5/1999 | Gans et al. .................. 365/201 |
| 6,185,139 B1 | * | 2/2001 | Pantelakis et al. ........... 365/201 |

FOREIGN PATENT DOCUMENTS

| | | |
|---|---|---|
| JP | 62-109354 | 5/1987 |
| JP | 62-119958 | 6/1987 |

(Continued)

OTHER PUBLICATIONS

Hideshi Fujii et al, "16–M DRAM LSI Device Memory DRAM Trench", The ISSCC, Nikkei Microdevice 1989.3, pp. 54–58, Toshiba Semiconductor Technology Laboratory, Japan, (w/English translation).

Primary Examiner—Tan T. Nguyen
(74) Attorney, Agent, or Firm—Antonelli, Terry, Stout & Kraus, LLP

(57) ABSTRACT

A semiconductor IC device includes, in a substrate, a P-type well region having a dynamic memory array section and applied with a reduced back bias voltage suitable for refreshing. Also included is a P-well region where N-channel MOSFETs of a peripheral circuit are formed. This P-well region is applied with a back bias voltage of an absolute value smaller than that applied to the P-type well of the memory array section. A P-type well section, where there are formed N-channel MOSFETs of an input circuit or an output circuit connected with external terminals, is applied with a back bias voltage of an absolute value large enough to provide a measure of protection against undershoot, while the refresh characteristics are improved by reducing the leakage current between the source/drain region connected with a capacitor and the P-type well, to thereby raise the operation speed of the peripheral circuit.

21 Claims, 10 Drawing Sheets

FOREIGN PATENT DOCUMENTS

| | | |
|---|---|---|
| JP | 63-86559 | 4/1988 |
| JP | 2-264462 | 10/1990 |
| JP | 3-58475 | 3/1991 |
| JP | 3-83289 | 4/1991 |
| JP | 3-232272 | 10/1991 |
| JP | 3-276673 | 12/1991 |
| JP | 4-212453 | 8/1992 |
| JP | 4-317372 | 11/1992 |
| JP | 5-189968 | 7/1993 |
| JP | 5-267617 | 10/1993 |
| JP | 06-85200 | 3/1994 |
| JP | 7-142605 | 6/1995 |
| JP | 08-8412 | 1/1996 |

* cited by examiner

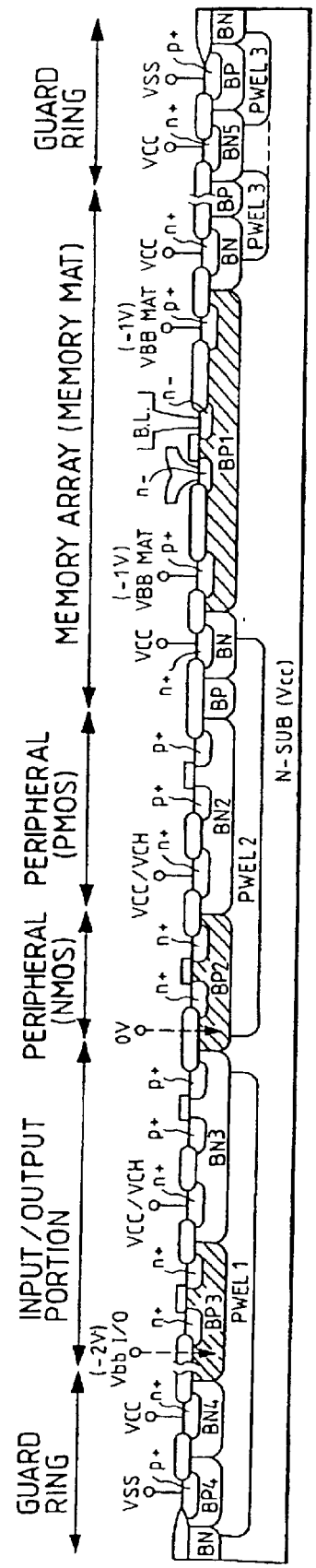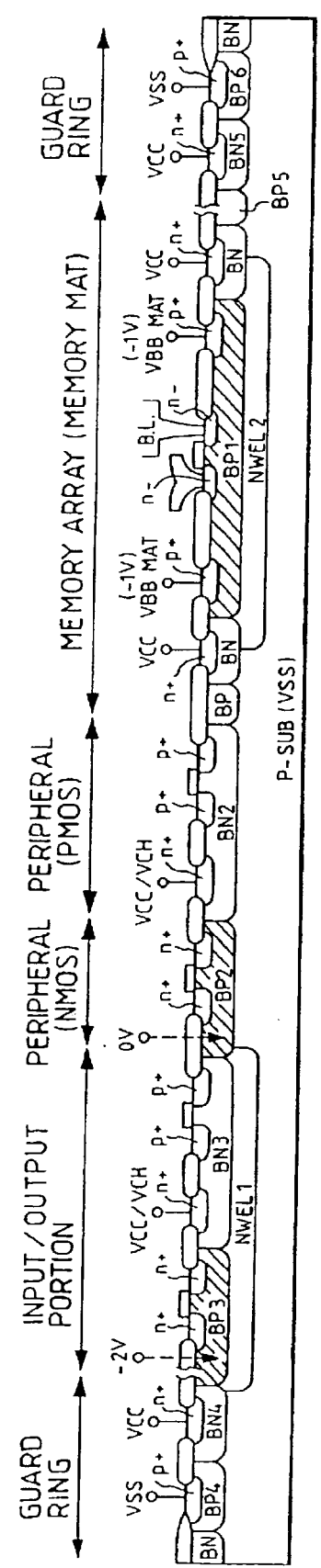
FIG. 4(a)
FIG. 4(b)

SEMICONDUCTOR INTEGRATED CIRCUIT DEVICE

This application is a continuation of U.S. application Ser. No. 10/091,064, filed Mar. 6, 2002 (now abandoned), which, in turn, is a divisional of U.S. application Ser. No. 09/572,906, filed May 17, 2000 (now abandoned), which, in turn, is a continuation of U.S. application Ser. No. 08/823,167, filed Mar. 25, 1997 (now U.S. Pat. No. 6,078,084), and which, in turn, is a continuation of U.S. application Ser. No. 08/476,761, filed Jun. 7, 1995 (now U.S. Pat. No. 5,654,577); and the disclosures of all of which are hereby incorporated by reference.

BACKGROUND OF THE INVENTION

The present invention relates to a semiconductor integrated circuit device and, more particularly, to a technique which is effective if applied to a device including a memory mat section where dynamic memory cells are arranged in a matrix and an input/output circuit connected with external terminals.

A dynamic RAM, in which the threshold voltage of MOSFETs contained therein is optimized by a triple-well structure, is proposed in "Nikkei Micro Device", pp. 54 to 58, issued in March, 1989, NIKKEI McGRAW-HILL. In this dynamic RAM, the memory cells formed on an N-substrate have their soft error resistance improved by making use of the P-type well and the N-type substrate junction, and data errors (data loss) which might be caused by the undershoot of input pins or by the minority carriers produced from the N-channel MOSFETs of the peripheral circuits, is eliminated to improve their data protecting characteristics.

Specifically, there is disclosed a technique of applying $V_{BB}$ to the P-well of memory mats, as in the prior art, and $V_{BB}$ to the P-well formed with an n-type peripheral circuit and an input protection circuit.

In the aforementioned triple-well structure, in order to solve the problem of the substrate effect resulting from the finer structure of the elements and the drop of the power supply voltage, the well region, in which there are formed the P-channel MOSFETs and the N-channel MOSFETs constituting the peripheral circuits, is fed with a bias voltage which characteristically optimizes the threshold voltage. On the other hand, the P-type well region of the memory array is fed with a back bias voltage, as in the prior art.

Japanese Patent Laid-Open No. 267617/1993 discloses a technique wherein, taking the refresh characteristics of memory cells into consideration, the ground potential is provided through a resistor to the P-well where the memory cells are formed and directly to the P-well where the peripheral circuits are formed.

Japanese Patent Laid-Open No. 276673/1991 discloses a technique wherein the absolute value of the well potential of the P-well, in which the N-MOS transistors included in peripheral circuits other than sense amplifiers are formed, is set higher (or deeper) than that of the well potential of the P-well where the N-MOS transistors of the sense amplifiers are formed; and the absolute value of the well potential of the P-well where the N-MOS transistors included in the sense amplifiers are formed is set higher (or deeper) than that of the well potential of the P-well where the N-MOSs included in the memory cells are formed.

Japanese Patent Laid-Open No. 83289/1991 discloses a technique for setting the threshold value of the MOS transistors constituting the memory cells higher than that of the MOS transistors constituting the peripheral circuits.

Japanese Patent Laid-Open No. 212453/1992 discloses a technique for setting the well potential of the P-well for the peripheral circuit section, including a data input buffer and a data output buffer, to the ground potential and setting the well potential of the P-well for the memory cell array to a negative potential or the ground potential.

Japanese Patent Laid-Open No. 317372/1992 discloses two techniques: one is a technique for setting the well potential of the P-well of the memory cell matrix region to an internal voltage, setting the well potential of the P-well where N-MOS transistors included in the peripheral circuits are formed to the ground potential, and setting the well potential of the P-well where N-MOSs for the output buffer are formed to the ground potential; the other is a technique for setting the well potential of the P-well of the memory cell matrix region to an internal voltage, setting the well potential of the P-well where the N-MOS transistors included in the peripheral circuits are formed to the ground potential, and setting the well potential of the P-well where an N-type impurity diffusion layer of the input protective device is formed to an internal voltage.

Japanese Patent Laid-Open No. 119958/1987 discloses two techniques: one is a technique for applying 0V to the P-well where the N-MOS transistors included in the memory cell array are formed, and applying −3V to the P-well where the N-MOS transistors included in the peripheral circuits are formed; the other is a technique for applying 0V to the P-well where the N-MOS transistors included in the memory cell array are formed and applying −3V to the P-well where the N-MOS transistors included in the input circuit and the input protection circuit are formed.

SUMMARY OF THE INVENTION

There is a tendency for the refresh characteristics to worsen as the structure of elements becomes finer. More specifically, it has been determined that the refresh period has a tendency to become shorter as the elements are made finer for a larger storage capacity. These refresh characteristics have been analyzed and the following has been determined by the Inventors: The reason why the back bias voltage is fed to the P-type well region where the memory cells are formed is because it is necessary to prevent the gate voltage of the unselected memory cell from being raised by the coupling that occurs with the bit lines, the switching MOSFETs from being weakly turned on, and the high or low level of the bit lines from being transmitted to a storage capacitor, by increasing threshold voltage of the switching MOSFETs for address selection. Conventionally, the back bias voltage is set only from this view point, and the aforementioned dynamic RAM is also fed with a high negative bias voltage $V_{BB}$, e.g., about −3V, taking the undershoot of the input pin into consideration.

With the finer structure of elements, however, the P-type impurity concentration has to be made higher as the channel stopper below the field insulating film between the memory cells, and the PN junction between the storage node (on the storage capacitor side) of the switching MOSFETs joined to the channel stopper and the source/drain diffusion layer needs to be heavily doped. It has been found that if the back bias voltage of the P-type well region where the memory array is formed is raised, as in the prior art, the leakage current through the PN junction consequently increases to shorten the refresh period, as described above. Further, it has been determined by the inventors that the operating speed of the peripheral circuits, such as sense amplifiers, an X-decoder and a Y-decoder, becomes low as the bias voltage becomes high, so that the bias voltage cannot be set equal to the back bias voltage of the P-type well region.

An object of the present invention is therefore to provide a semiconductor integrated circuit device which can simultaneously improve the refresh characteristics of dynamic memory cells, the noise-resistance characteristics of the input (output) circuit and the operating speed of peripheral circuits.

The aforementioned and other objects and novel features of the present invention will become apparent from the following description with reference to the accompanying drawings.

A representative one of the inventions disclosed herein will be summarized as follows: A P-type well region, wherein there is formed a memory mat section (portion) in which dynamic memory cells are arranged in a matrix, is fed with a back bias voltage whose absolute value is made small so as to be the most suitable for the refresh characteristics; a P-well region, wherein there are N-channel MOSFETs of peripheral circuits such as sense amplifiers, an X(row)-address decoder or a Y(column)-address decoder is fed with a back bias voltage whose absolute value is made small considering the high-speed operation; and a P-type well region, wherein there are formed the N-channel MOSFETs of the input circuit or the output circuit connected to external terminals, is fed with a back bias voltage whose absolute value is made large considering the undershoot voltage.

By the above-specified means, the P-type well region, where in the memory array section is formed, is fed with a requisite minimum back bias voltage, so that the P-type well region where the input circuit or the output circuit corresponding to the external terminals is formed can be fed with a back bias voltage to serve as a measure against the undershoot, while improving current between the source/drain region connected to a capacitor and the P-type well, and further the operation speed of the peripheral circuit can be raised.

BRIEF DESCRIPTION OF THE DRAWINGS

FIGS. 4(a) and 4(b) are structural schematic sections of an element, showing one embodiment of the dynamic RAM according to the present invention;

DESCRIPTION OF THE PREFERRED EMBODIMENTS

Figure 1:
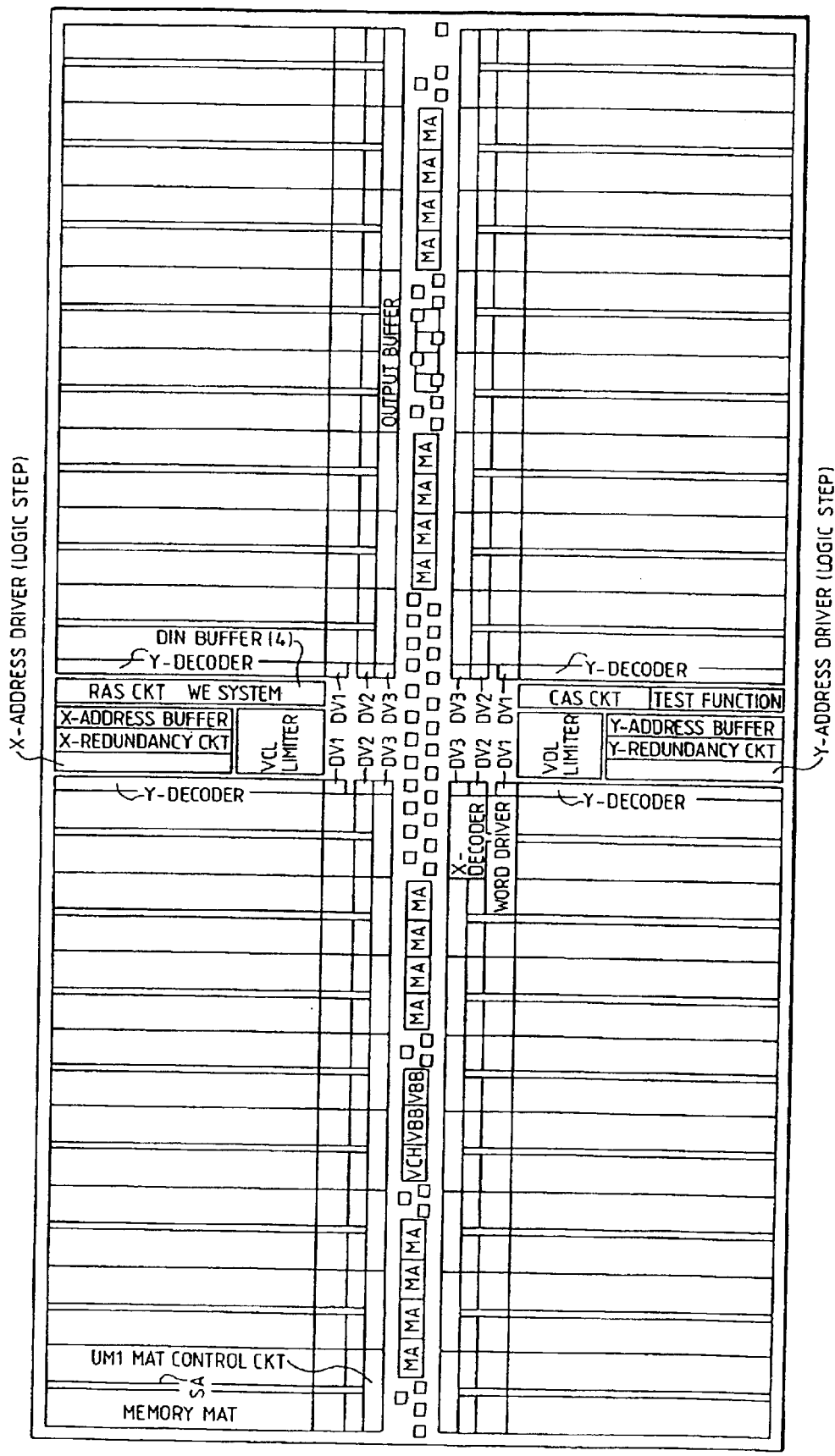
FIG. 1 is a block diagram showing one embodiment of a dynamic RAM to which is applied the present invention.

FIG. 1 is a block diagram of a dynamic RAM to which is applied the present invention. The individual circuit blocks of FIG. 1 are formed on a single semiconductor substrate of single crystal silicon by a well-known semiconductor integrated circuit manufacturing technique. The individual circuit blocks are drawn to match the geometric arrangement in the actual semiconductor chip. In this specification, the term "MOSFET" will be used to refer to an insulated-gate field-effect transistor (IGFET).

In this embodiment, in order to prevent the operating speed from being lowered because of the long wirings for control signals and memory array drive signals, resulting from the enlargement of the chip size due to the increase in the capacity of the memory, the following has been made in the arrangement of a memory array section constituting the RAM and its peripheral section for address selection.

In the same Figure, there is provided a cross area which is formed of a vertical central portion and a lateral central portion of the chip. This cross area is provided mainly with peripheral circuits, and the four areas defined by the cross area are provided with memory arrays. In short, the cross area is provided at the vertical and lateral central portions, and in the four areas defined by the cross area, the memory arrays are formed. Although not specifically limited thereto, the four memory arrays are individually given a storage capacity of about 4 Mbits, as will be described hereinafter. As a result, the four memory arrays are given a total storage capacity as high as about 16 Mbits.

One memory mat MEMORY MAT is so arranged that word lines are laterally extended and a pair of parallel complementary bit lines (data lines or digit lines) are vertically extended. The memory mats MEMORY MAT are arranged in pair on both sides of the sense amplifier SA. This sense amplifier SA is of a so-called "shared sense amplifier", which is used commonly by the paired memory mats MEMORY MAT.

The four split memory arrays are individually provided at their central sides with Y-selectors Y-DECODER. Y-selection lines are extended from the Y-selectors Y-DECODER over the plurality of memory mats MEMORY MAT corresponding to the Y-selectors Y-DECODER, and used to switch the gates of the column switching MOSFETs of the individual memory mats MEMORY MAT.

On a lefthand side of the lateral central portion of the aforementioned chip, there are provided X-related circuits including an X-address buffer X-ADDRESS BUFFER, an X-redundancy circuit X-REDUNDANCY CKT and an X-address driver X-ADDRESS DRIVER (logic step LOGIC STEP); a RAS control signal circuit RAS CKT; a WE signal control circuit WE SYSTEM; a data input buffer DIN BUFFER; and an internal voltage limiter VCL LIMITER. The internal voltage limiter VCL LIMITER is disposed here at the center of this area and receives an external voltage source VCCE at about 5V to generate a constant voltage VCL corresponding to a voltage of about 3.3V fed to the internal circuit.

At a righthand side of the lateral central portion of the aforementioned chip, there are provided: Y-related circuits including a Y-address buffer Y-ADDRESS BUFFER, a Y-redundancy circuit Y-REDUNDANCY CKT and a Y-address driver Y-ADDRESS DRIVER (logic step LOGIC STEP); a CAS control signal circuit CAS CKT; and a test circuit TEST FUNCTION. In the chip central portion, there is provided an internal voltage limiter VDL LIMITER for generating a power supply voltage VCL for peripheral circuits such as an address buffer and a decoder.

If the address buffers, the X- and Y-redundancy circuits X- and Y-REDUNDANCY CKT having address comparators corresponding to the address buffers, and the CAS and RAS control signal circuits CAS and RAS CKT are arranged concentratedly at one place, as descried above, a high integration can be achieved and the signals can be transmitted through the shortest and equal distance paths to the address drivers (logic steps) by, for example, separating the clock generators from other circuits on both sides of the wiring channel, namely, by using these wiring channel commonly.

The RAS control circuit RAS CKT is used to receive a row address strobe signal RASB to activate the X-address buffer X-ADDRESS BUFFER. The address signal taken in by the X-address buffer X-ADDRESS BUFFER is fed to the X-redundancy circuit X-REDUNDANCY CKT. Here, a comparison is made with the stored faulty address to judge whether or not switching to the redundancy circuit is made. This result and the address signal are fed to the X-predecoder. Here, a predecoding signal is generated and fed through X-address drivers DV2 and DV3 corresponding to the individual memory arrays, to individual X-decoders X-DECODER corresponding to the aforementioned memory mats.

On the other hand, the internal signal of the aforementioned RAS CKT is fed to the WE signal control circuit WE SYSTEM and the CAS control signal circuit CAS CKT. For example, the automatic refresh mode (CBR) and the test mode (WCBR) are recognized by judging the input sequence of the aforementioned RASB signal, a column address strobe signal CASB and a write enable signal WEB. In the test mode, the test circuit TEST FUNCTION is activated and the test function is set according to a specific address signal fed at each timing in the individual private test modes provided for public/standard purposes or as needed.

The CAS control signal circuit CAS CKT is provided for receiving the signal CASB to produce various Y-related control signals. The address signal, which is taken in the Y-address buffer Y-ADDRESS BUFFER in synchronism with the change of the signal CASB to the low level, is fed to the Y-redundancy circuit Y-REDUNDANCY CKT. Here, a comparison is made with the stored faulty address to judge whether or not switching to the redundancy circuit is made. This result and the aforementioned address signal are fed to the Y-predecoder. This predecoder generates a predecoding signal. This predecoding signal is fed through the Y-address drivers DV1 corresponding to the four memory arrays, to the individual Y-decoders Y-DECODER. On the other hand, the aforementioned CAS control signal circuit CAS CKT activates the adjoining test circuit TEST FUNCTION when it receives the RASB signal and the WEB signal, as described above, and recognizes the test mode from their input sequence.

In the upper portion of the vertical central portion of the aforementioned chip, there are arranged totally sixteen memory mats MEMORY MAT and eight sense amplifiers SA, which are laterally symmetric with respect to the center axis of the areas. Of these, four main amplifiers MA corresponding to the four sets of memory mats MEMORY MAT and sense amplifiers SA are provided on each of left and right sides. In addition, there are provided at the upper part of the vertical central portion a booster circuit VCH for receiving the internal limit voltage to select a word line and an input pad area responding to input signals such as an address signal or a control signal.

In this embodiment, one block is provided with the eight memory mats MEMORY MAT and four sense amplifiers SA, and accordingly a total of sixteen memory mats MEMORY MAT and eight sense amplifiers SA are provided laterally symmetrically with respect to the aforementioned vertical axis. By using the main amplifiers MA the number of which is as small as four, in this construction, the amplified signals from the individual sense amplifiers SA can be transmitted through the short signal transmission paths to the main amplifiers MA.

In the lower part of the vertical central portion of the aforementioned chip, there are also arranged totally sixteen memory mats MEMORY MAT and eight sense amplifiers SA, which are laterally symmetric with respect to the center axis of the areas. Of these, four main amplifiers SA corresponding to four sets of memory mats MEMORY MAT and sense amplifiers SA on each of both sides are provided.

In addition, there are provided substrate voltage generators VBB for generating negative bias voltages to be fed to the substrate by receiving the internal limit voltage, input pad areas corresponding to the input signals such as the address signals and the control signals, and a data output buffer circuit OUTPUT BUFFER. By using the main amplifiers MA the number of which is as small as four like the above case, the amplified signals from the individual sense amplifiers SA can be transmitted through the short signal transmission paths to the main amplifiers MA.

The region of the aforementioned vertical central portion is provided with a variety of bonding pads, although omitted in the same Figure. These bonding pads include, e.g., pads for supplying external power, and as many as totally ten and several pads are arranged generally in line for supplying the ground potential of the circuit to increase the input level margin, i.e., to lower the power supply impedance. These ground potential pads are connected to the ground potential leads which are formed by an LOC technique and extended in the vertical direction. Some of these ground pads are especially provided mainly to lower the power supply impedance. For example, pads for clearing the word lines, pads for preventing the floating of the unselected word lines of the word driver due to the coupling, and pads for the common source of the sense amplifiers.

As a result, the ground potential of the circuit can minimize not only the generation of noise but also the propagation of the noise of the circuit grounding lines between the internal circuits, classified into a plurality of kinds, because the power supply impedance is lowered with respect to the operation of the internal circuit and the grounding lines between the internal circuits are connected by a low-pass filter made up of an LOC lead frame and bonding wires.

In this embodiment, the pads corresponding to the external power supply VCC of about 5V are so provided as to correspond to the internal limiters VCL and VDL LIMITER which perform the aforementioned voltage transformation. This provision is made, as described above, to lower the power supply impedance and to suppress the noise propagation of the voltages (VCL, VDL and VCC) between the internal circuits.

Pads for inputting addresses and pads for the control signals RAS, CAS, WE and OE are arranged in the area of the aforementioned central portion. There are further provided not only the data inputting and outputting pads but also the following pads for bonding mastering, monitoring and controlling the monitoring pads.

The bonding mastering pads include those for designating a static column mode, a nibble mode and a write mask function for the construction of ×4 bits. The monitoring pads include those for monitoring the internal voltages VCL, VDL, VL, VBB, VCH and VPL. The VPL monitoring judges, in a probing, whether or not the VPL adjustment has been properly made.

The internal voltage limiter VCL LIMITER produces the power supply voltage of about 3.3V for the peripheral circuits. The internal voltage limiter VDL LIMITER produces the power supply voltage VDL of about 3.3V fed to the memory arrays, i.e., the sense amplifiers SA. The booster circuit VCH receives the internal voltage VCL to produce a word line selecting level boosted to about 5.3V and a boost power supply voltage for selecting the shared switch MOSFET. There are provided two substrate voltage generators, one of which produces a voltage of −2V fed to a P-type well region provided with the N-channel type MOSFETs constituting the input/output circuit, and the other of which produces a voltage of −1V fed to a P-type well region provided with the memory mat MEMORY MAT. The plate voltage generator VPL produces the plate voltage of the memory cells.

In the dynamic RAM of this embodiment, the P-type well regions provided with the N-channel MOSFETs are classified into the following three in accordance with the back bias voltages fed thereto. The first P-type well regions are the peripheral circuits (the first circuit portion) of the aforementioned memory arrays, and the peripheral circuits include the precharging circuits for precharging the data lines connected with the dynamic memory cells, the sense amplifiers, and the switch MOSFETs for connecting the sense amplifiers and the data lines. The second P-type well regions are provided with the memory arrays, in which the dynamic memory cells are arranged in a matrix, and the third P-type well regions are provided with the input circuit or the output circuit (the second circuit portion) connected with external terminals. The aforementioned memory arrays are portions where only the memory cells are arranged in matrices.

The three-divided P-type well regions described above do not imply that there are three regions physically. Specifically, the second P-type well regions where the memory arrays are formed are a plurality of regions corresponding to the memory mats divided in plurality. Likewise, the first P-type well regions provided with the peripheral circuits is a plurality of regions corresponding to the aforementioned memory mats and the logic circuit blocks constituting the address decoders and the control circuits. Moreover, the third P-type regions are suitably divided because the input/output circuits connected with the external terminals are separated by the circuits such as the main amplifiers MA and the voltage generators VCH and VBB, as shown in FIG. 1.

The second P-type well regions provided with the memory arrays are fed with a back bias voltage having a small absolute value such as −1V for the reasons which will be described later. On the contrary, the third P-type well regions provided with the input/output circuits (the second circuit portion) are fed with a back bias voltage having a large absolute value, e.g., −2V that no forward bias is applied between the semiconductor region, to which it is transmitted by the undershoot of the external terminals, and the P-type well region. The first P-type well regions pro-vided with the peripheral circuits (the first circuit portion) other than the aforementioned memory arrays and input/output circuits are fed with the ground potential of the circuit. As a result, the threshold voltage of the MOSFETs of the peripheral circuits can be lowered to raise the operation speed. Especially in the structure in which the supply voltage is lowered to 3.3V and the internal voltage is lowered to about 2.2V by the internal limiters, the conductance of the MOSFETs for the input signals of such small amplitudes can be increased to raise the operation speed.

Of the three divided P-type well regions, the first P-type well regions where the peripheral circuits are formed are fed with the ground potential of the circuits, so that no substrate bias generator is provided. In order that the other two, i.e., second and third P-type well regions are fed with the different back biases, there are provided the two substrate bias voltage generators VBB, as described above.

Of the circuits shown in FIG. 1, the circuits belonging to the peripheral circuits (the first circuit portion, the first circuit, or the first circuit section) include the following: The sense amplifiers SA; the X-selector (the first decoder) X-DECODER; the Y-selector (the second decoder) Y-DECODER; the X-redundancy circuit X-REDUNDANCY CKT; the X-address driver X-ADDRESS DRIVER; the Y-redundancy circuit Y-REDUNDANCY CKT; the Y-address driver Y-ADDRESS DRIVER; the internal voltage limiter VDL LIMITER; the internal voltage limiter VCL LIMITER; the main amplifiers MA; the (boosted) voltage generator VCH; and the (substrate) voltage generator VBB; and the test circuit TEST FUNCTION.

Of the circuits shown in FIG. 1, the circuits belonging to the input/output circuits (the second circuit portion, the chip internal/external interface portion, the second circuit, or the second circuit section) connected to the external terminals include the following: The RAS (Row-Address Strobe) control signal circuit RAS CKT; the CAS (Column Address Strobe) control signal circuit CAS CKT; the WE (Write Enable) signal control circuit WE SYSTEM; the data input buffer DIN BUFFER; the data output buffer OUTPUT BUFFER; the X-address buffer X-ADDRESS BUFFER; and the Y-address buffer Y-ADDRESS BUFFER. Incidentally, the data input buffer and the data output buffer may be arranged close to each other and united into an input/output buffer. Of the RAS control circuit RAS CKT, only the RAS signal buffer portion coupled directly to the external RAS signal terminal for receiving the RAS signal may be defined as the input/output circuit (the second circuit portion), and the circuits of the succeeding stages may be defined as the peripheral circuits. Of the CAS control signal circuits, only the CAS signal buffer portion coupled directly to the external CAS signal terminal for receiving the CAS signal may be defined as the input/output circuit (the second circuit portion), and the circuits of the succeeding stages may be defined as the peripheral circuits. Of the WE signal control circuit WE SYSTEM, only the WE buffer portion coupled directly to the external WE signal terminal for receiving the WE signal may be defined as the input/output circuit (the second circuit portion), and the circuits of the succeeding stages may be defined as the peripheral circuits.

The sense amplifiers SA are arranged between the memory mats constituting the memory array. In order to reduce the area occupied by the memory mats and the sense amplifiers SA, the N-channel MOSFETs in the memory mats and the N-channel MOSFETs in the sense amplifiers SA may be formed in the same p-well. In this case, the sense amplifiers is not included in the peripheral circuits (the first circuit portion). In order to reduce the area occupied by the memory mats and the X-selectors (or Y-selectors), moreover, the N-channel MOSFETs in the memory mats and the N-channel MOSFETs in the X-selector (or Y-selector) may be formed in the same p-well. In this case, the X-selector (or the Y-selector) is not included in the peripheral circuits (the first circuit portion). The X-address buffer and the Y-address buffer may be included together to define the address signal input circuit. In this case, the address signal input circuit is coupled to the external address input terminal for receiving the (external) X-address signal and the (external) Y-address signal, to produce the internal X-address signal (the first internal address signal) on the basis of the X-address signal (the first address signal) and to produce the internal Y-address signal (the second internal address signal) on the basis of the Y-address signal (the second address signal). The external terminals include, the address signal input terminals fed with the X-address signal and the Y-address signal, the row address strobe signal input terminal; the column address strobe signal input terminal, the write enable signal input terminal, the chip enable signal input terminal, and the data (input/output) terminals for inputting the external data or for outputting the internal data.

Figure 2:
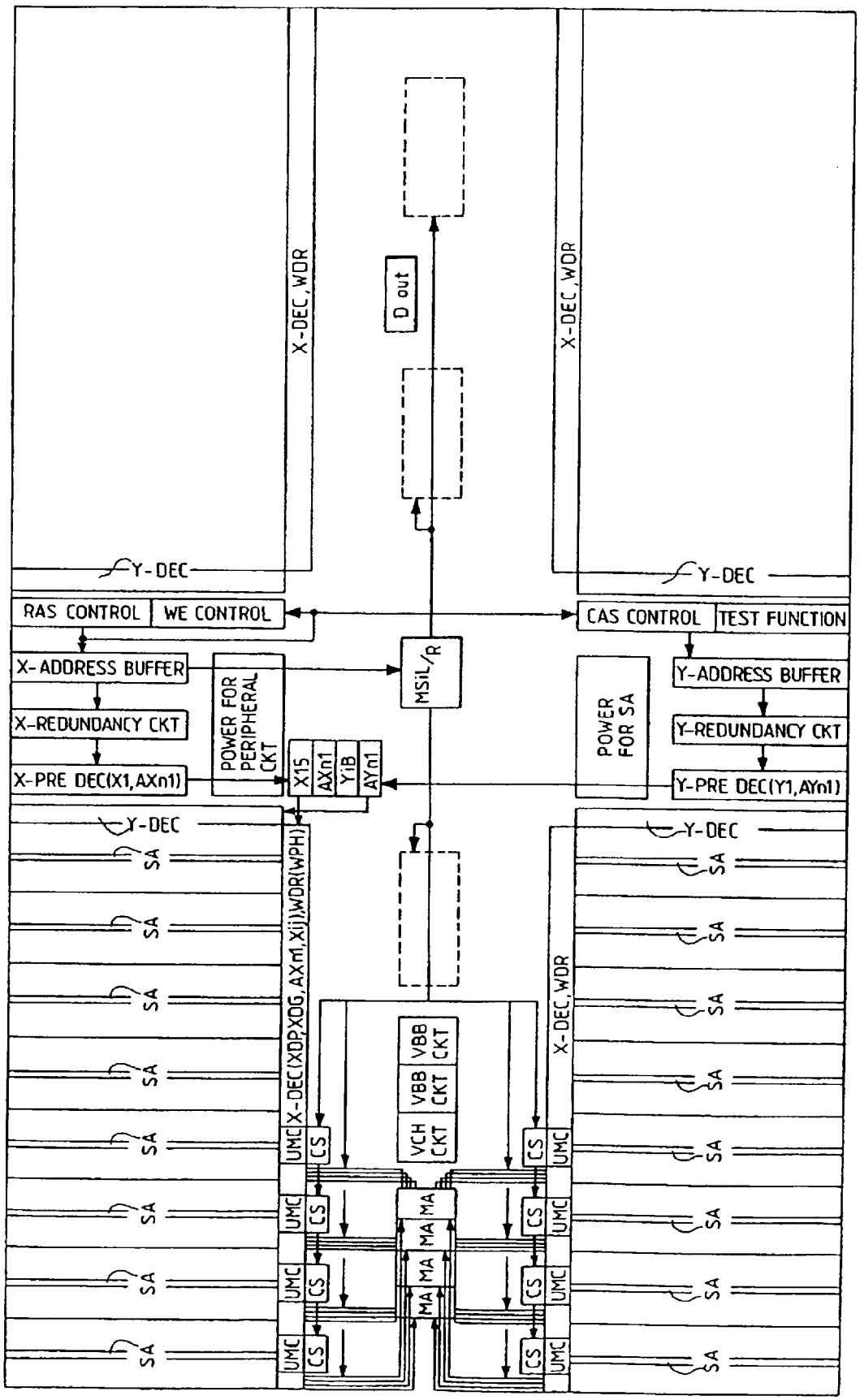
FIG. 2 is a block diagram of one embodiment in which control signals in the dynamic RAM to which is applied the present invention are notably shown.

FIG. 2 is a block diagram in which the control signals are especially shown in the dynamic RAM to which is applied the present invention. FIG. 2 is drawn in conformity with the aforementioned layout diagram of FIG. 1.

The RAS control circuit RAS CKT is used to activate the X-address buffer X-ADDRESS BUFFER on receiving to the signal RASB. The address signal received by the X-address buffer X-ADDRESS BUFFER is fed to the X-redundancy circuit X-REDUNDANCY CKT. Here, a comparison is made with the stored faulty address to decide whether or not switching is made to the redundancy circuit.

The result and the aforementioned address signal are fed to the X-predecoder X-PRE DEC (X1, AXn1). Here are produced the predecode signal Xi and AXn1, which are fed through the X-address drivers XiB and AXn1 corresponding to the respective memory arrays, to the respective X-decoders X-DEC so provided as to correspond to the aforementioned memory mats MEMORY MAT. In FIG. 2, only one driver is shown as a representative.

The internal signals of the RAS are fed to the WE control circuit WE CONTROL and the CAS control circuit CAS CONTROL (CKT). For example, the order of inputting the RASB signal, the CASB signal and the WEB signal is determined to recognize the automatic refresh mode (CBR) and the test mode (WCBR). In the test mode, the test circuit TEST FUNCTION is activated to set the test function in accordance with the specific address signals which are fed when in the aforementioned public/standardization test mode and in the private test mode.

Of the address signals received by the aforementioned X-address buffer X-ADDRESS BUFFER, the address signal for commanding the selection of the memory mats is transmitted to the mat select circuit MSIL/M, and one of the plurality of memory mats MEMORY MAT provided in each memory array is selected. Here, CSs so provided as to correspond to the memory mat MEMORY MAT are common source switching MOSFET.

The four main amplifiers MA correspond to the four pairs of complementary data lines (4 bits) from total of eight memory mats which are laterally symmetric with respect to the main amplifiers MA. One of the eight memory mats is selected in response to the memory mat select signal MSiL/R. This selection is executed by a unit mat control circuit UMC. FIG. 2 shows one set of four pairs of main amplifiers MA, whereas the other three sets of main amplifiers are shown in the form of black boxes by broken lines.

The mat selecting circuit MSiL/R produces four selecting signals MS0L/R to MS3L/R. When the signal MS0L is produced, for example, the four corresponding memory mats are selected. Since these four memory mats MS0L have input/output nodes of 4 bits respectively, they correspond to the aforementioned four main amplifiers MA.

The CAS control circuit CAS CONTROL (CKT) is used to provide a variety of Y-control signals in response to the signal CASB. In synchronism with a change of the signal CASB to the low level, the address signal received by the Y-address buffer Y-ADDRESS BUFFER is fed to the Y-redundancy circuit Y-REDUNDANCY CKT. Here, a comparison is made with the stored faulty address to judge whether or not switching is made to the redundancy circuit.

This result and the aforementioned address signal are fed to the Y-predecoder Y-PRE DEC (Y1, AYn1). Here are produced the predecode signals Y1 and AYn1. These predecode signals Yi and AYn1 are fed to the respective Y-decoders Y-DEC through the Y-address drivers (the final stage) YiB and AYn1 so provided as to correspond to the four individual memory arrays. In FIG. 2, only one Y-driver YiB and AYn1B is shown as a representative.

The aforementioned CAS control circuit CAS CONTROL (CKT) activates the adjoining test circuit TEST FUNCTION when it receives the RASB signal and the WEB signal to recognize the test mode by judging their input order.

Although omitted in FIG. 2, the bonding pads fed with the address signals and the control signals are gathered and arranged in the central portion of the chip. As a result, the distance from each pad to the corresponding circuit can be shortened to a substantially equal length. By adopting this layout of the embodiment, therefore, the address signals and the control signals can be taken in at a high speed while minimizing the skew which is caused between the address signals of plural bits.

As shown in FIG. 2, the power supply VDL for the sense amplifiers (SA) and the power source VCL for the peripheral circuits are also arranged in the central portion of the chip. As a result, the various voltages can be supplied to the circuits arranged at the four corners of the chip, through the short and equal length wirings. In the circuits, moreover, capacitors, not shown, are dispersedly arranged along the power supply lines. They have relatively large capacitance to stabilize the voltage, i.e., to lower the power supply impedance.

Figure 3:
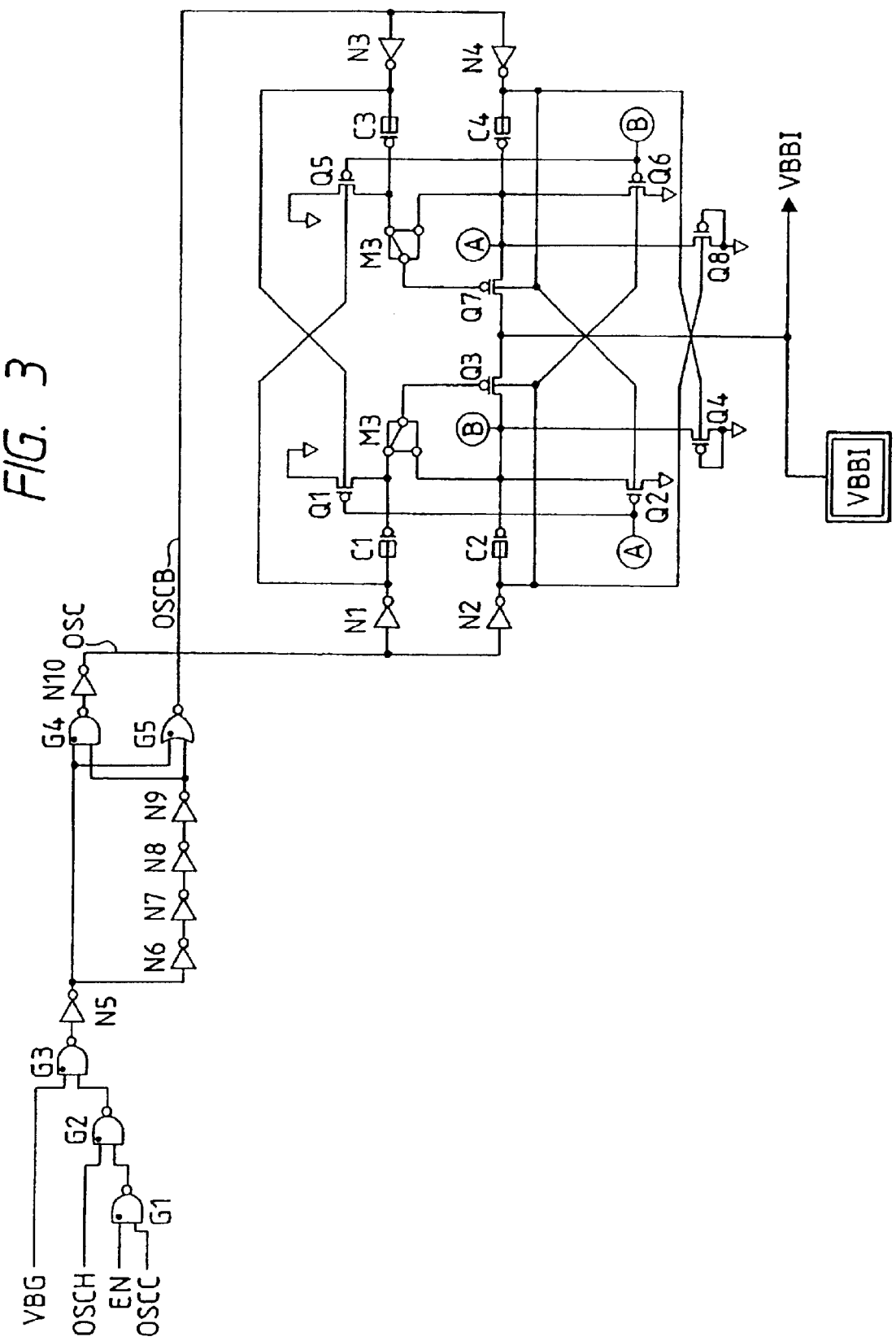
FIG. 3 is a circuit diagram showing one embodiment of a substrate bias generator.

FIG. 3 is a circuit diagram showing one embodiment of the substrate bias generator. The substrate bias generator of this embodiment is a circuit for producing the back bias voltage having a high absolute value such as −2V fed to the second P-type well regions where the aforementioned input/output circuits are formed.

In order to generate the substrate bias voltage efficiently with a low power consumption, oscillation pulses OSC and OSCB are intermittently fed to the next charge pump circuit, as in the case where the absolute value of the bias voltage is decreased from the above value, 2, of −2V by the later-described control circuit, to generate the negative back bias voltage VBB1 so that the back bias voltage of −2V may be established. The aforementioned oscillation pulses OSC and OSCB are so produced as to be in the opposite phases but not overlapped by the pulse generator which is constructed of inverter circuits N6 to N9 constituting a delay circuit, gate circuits G4 and G5 and an output inverter circuit N10.

The aforementioned oscillation pulses OSC and OSCB in the opposite phases are transmitted to two alternately operating charge pump circuits, so that the preparatory operation and the output operation are alternately effected to produce a negative voltage efficiently. Specifically, when the oscillation pulse OSC is at the low level, the outputs of the inverter circuits N1 and N2 are at the high level. Since, at this time, the P-channel MOS-FETs Q1 and Q2 are turned on by the negative voltage of the potential of the node A, the capacitors C1 and C2 are precharged.

At this time, the oscillation pulse OSCB is at the high level, the voltage held by the capacitor C3, which has been charged up in the previous cycle by the low level of the output signal of the inverter circuit N3, is turned negative to turn on the P-channel type switching MOSFET Q7. As a result, in response to the low level of the inverter circuit N4 corresponding to the high level of the oscillation pulse OSCB, the negative voltage of the node A of the capacitor C4 is also outputted as the back bias voltage VBB1 through the switching MOSFET Q7.

Next, when the oscillation pulse OSC changes to the high level, the output signal of the inverter circuit N1 changes to the low level so that the voltage held by the capacitor C3 is turned negative by the aforementioned previous charge-up operation, to turn on the P-channel type switching MOSFET Q3. In synchronism with this, the output signal of the inverter circuit N2 is also changed to the low level so that the negative voltage of the node B of the capacitor C2 is outputted as the back bias voltage VBB1 through the aforementioned switching MOSFET Q3 in the ON state.

At this time, the oscillation pulse OSCB is at the low level, and the P-channel type MOSFETs Q5 and Q6 are on by the high level of the output signal of the inverter circuits N3 and N4 and the negative voltage of the node B so that the capacitor C3 and C4 are charged up. When the oscillation pulses OSC and OSCB are changed, the negative voltage outputting operation is executed on one side whereas the charge-up operation is executed on the other side, so that an efficient charge pumping action is executed.

Reference designator M3 designates the metal wiring which can be formed by a master slice method to make a diode connection of the MOSFETs Q3 and Q7. At this time, the negative voltage produced by the aforementioned capacitors C1 and C3 is invalidated so that the negative voltage to be produced by the capacitor C2 or C4 is lowered by the threshold voltage of the MOSFETs Q3 and Q7 and is outputted.

The substrate bias generator for supplying a bias voltage of −1 V to the first P-type well regions where the memory array are formed is constructed of a circuit similar to the circuit of FIG. 3. However, the operating voltages of the inverter circuits N1 to N4 for establishing the high level to precharge the capacitors C1 to C4 are low voltages produced by the internal limiter. For example, when the power supply voltage supplied from the external terminals is at 5V, the operating voltage is the constant voltage VDL such as of about 3.3 V, as described above. When the power supply voltage fed from the external terminals is at about 3.3V, it is the constant voltage VDL such as of about 2.2V, established by the internal limiter.

When the power supply voltage VCCE supplied from the external terminals is about 5V whereas the constant voltage VDL of the internal voltage limiter is about 3.3V, as described above, the wiring M3 in the charge pump circuit for producing the bias voltage fed to the first P-type well region is made by connecting the aforementioned MOSFETs Q3 and Q7 in the form of a diode by the aforementioned master slice method. As a result, the bias voltage such as of −1 whose absolute value is small, as described above, is produced by making use of the voltage drop due to the threshold voltage of those MOSFETs Q3 and Q4.

When the power supply voltage VCCE supplied from the external terminals is at about 3.3 V whereas the constant voltage VDL of the internal voltage limiter is as low as about 2.2 V, in the charge pump circuit for producing the bias voltage fed to the first P-type well region, a switching signal of a negative voltage is produced by the capacitors C1 and C3 through the wiring M3 by the aforementioned master slice method. These MOSFETs Q3 and Q7 are switched to efficiently produce the back bias voltage of −1V, as above, even at the low voltage as described above.

The gate circuits G1 to G3 intermittently output the oscillation pulses OSC and OSCB in accordance with the combination of the signals fed to their inputs so that the substrate bias voltage may be set to −2V, as described above. As a result, the useless current consumption is suppressed, and the substrate bias voltage is controlled to a constant level. Moreover, when the power supply voltage is raised for the burn-in test, the substrate bias voltage is raised in response to the rise of the power supply voltage. The substrate bias circuit for producing the substrate bias voltage such as of −1V of the aforementioned memory array is also equipped with a control circuit for raising the bias voltage in accordance with the constant voltage and the burn-in test.

FIGS. 4(a) and 4(b) are sections showing the schematic element structure in a dynamic RAM according to the present invention. FIG. 4(A) presents an example using an N-type substrate (N-SUB), and FIG. 4(B) presents an example using a P-type substrate (P-SUB).

In FIG. 4(A), the N-type substrate is used. This embodiment has a triple-well structure using the N-type substrate. In this N-type substrate N-SUB, deep P-type wells PWELL#1 and PWELL#2 are formed. In this deep P-type well PWELL#1 formed are a third P-type well region BP3 where an N-channel MOSFET constituting the input/output section is formed, and a third N-type well region BN3 where a P-channel MOSFET is formed.

The third N-type well region BN3 where formed is the P-channel MOSFET constituting the aforementioned input/output section is fed with a power supply voltage VCC or the boosted voltage VCH. The third P-type well region BP3 where formed is the N-channel MOSFET constituting the aforementioned input/output section is fed with a bias voltage VbbI/01 of −2V, which is produced by the aforementioned substrate bias generator, although not shown in detail. The P-type well region PWELL#1 where formed is the input/output section is fed with the ground potential VSS of the circuit through a P-type well region BP4. The N-Type well region BN4 constituting a guard ring is fed with the power supply voltage VCC, and absorbs the minority carriers in the deep P-type well region PWELL.

The N-channel MOSFET and the P-channel MOSFET constituting the peripheral circuit are formed in the second P-type well region BP2 and the second N-type well region BN2 formed in the deep P-type well region PWELL#2 isolated from the deep P-type well region PWELL#1 constituting the input/output section. The second N-type well region BN2 where formed is the P-channel MOSFET constituting the peripheral circuit is fed with the power supply voltage VCC or the boosted voltage VCH. As will be described later, for example, the second N-type well region BN2 where formed is the P-channel MOSFET constituting the word driver to produce the selecting signal of the word lines in response to the boosted voltage is fed with the boosted voltage VCH. The second N-type well region BN2 where formed is the P-channel MOSFET constituting the circuit such as a decoder operated by the internal power supply voltage is fed with the voltage VCC. The second P-type well region BP2 where formed is the N-channel MOSFET is fed with the ground potential VSS (Vbbperi), although not shown in detail.

The first P-type well region BP1 where formed is the memory array (or memory mats) is formed in the aforementioned N-substrate N-SUB and is fed with a substrate bias voltage VBBmat of −1V. Around this memory array, there is provided a guard ring which includes a pair of deep P-type well regions PWELL#3 and an N-type well region BN5 sandwiched by the P-Type well regions PWELL#3 in the N-type substrate N-SUB.

In FIG. 4(B), there is used the P-type substrate. This embodiment has a triple-well structure using the P-type substrate. In this P-type substrate P-SUB, deep N-type wells NWELL#1 and NWELL#2 are formed. In this deep N-type well NWELL#1 formed are a third P-type well region BP3 where an N-channel MOSFET constituting the input/output section if formed, and a third N-type well region BN3 where a P-channel MOSFET is formed.

The third N-type well region BN3 where formed is the P-channel MOSFET constituting the aforementioned input/output section is fed with the power supply voltage VCC or the boosted voltage VCH. The third P-type well region BP3 where formed is the N-channel MOSFET constituting the aforementioned input/output section is fed with the bias voltage VbbI/01 of −2V, which is produced by the aforementioned substrate bias generator, although not shown in detail. The N-type well region NWELL#1 where formed is the input/output section is fed with the power source voltage VCC. The fourth N-type well region BN4 constituting the guard ring is fed with-the power supply voltage VCC. The fourth P-type well region BP4 is fed with the ground potential VSS. The substrate P-SUB is fed with the ground potential VSS of the circuit.

The N-channel MOSFET and the P-channel MOSFET constituting the peripheral circuit are formed in the second P-type well region BP2 and the second N-type well region BN2 formed in the P-type substrate P-SUB. The second N-type well region BN2 where formed is the P-channel MOSFET constituting the peripheral circuit is fed with the power supply voltage VCC or the boosted voltage VCH. As will be described later, for example, the second N-type well region BN2 where formed is the P-channel MOSFET constituting the word driver to produce the selecting signal of the word lines in response to the boosted voltage is fed with the boosted voltage VCH. The second N-type well region BN2 where formed is the P-channel MOSFET constituting the circuit such as a decoder operated on the internal power supply voltage is fed with the voltage VCC (Vbbperi). The second P-type well region BP2 where formed is the N-channel MOSFET is fed with the ground potential VSS, although not shown in detail.

The memory array (or memory mats) is formed in the first P-type well region BP1 which is formed in the deep N-type well region NWELL#2. This first P-type well region BP is fed with the substrate bias voltage VBBmat of −1V. In the periphery of the memory array, there is provided a guard ring which includes a shallow N-type well region BN5 and a pair of shallow fifth and sixth P-type well regions BP5 and BP6 so formed as to sandwich the shallow N-type well region BN5. The fifth N-type well region BN5 is fed with the power supply voltage VCC, and the sixth P-type well region BP6 is fed with the ground potential VSS of the circuit.

Figure 5:
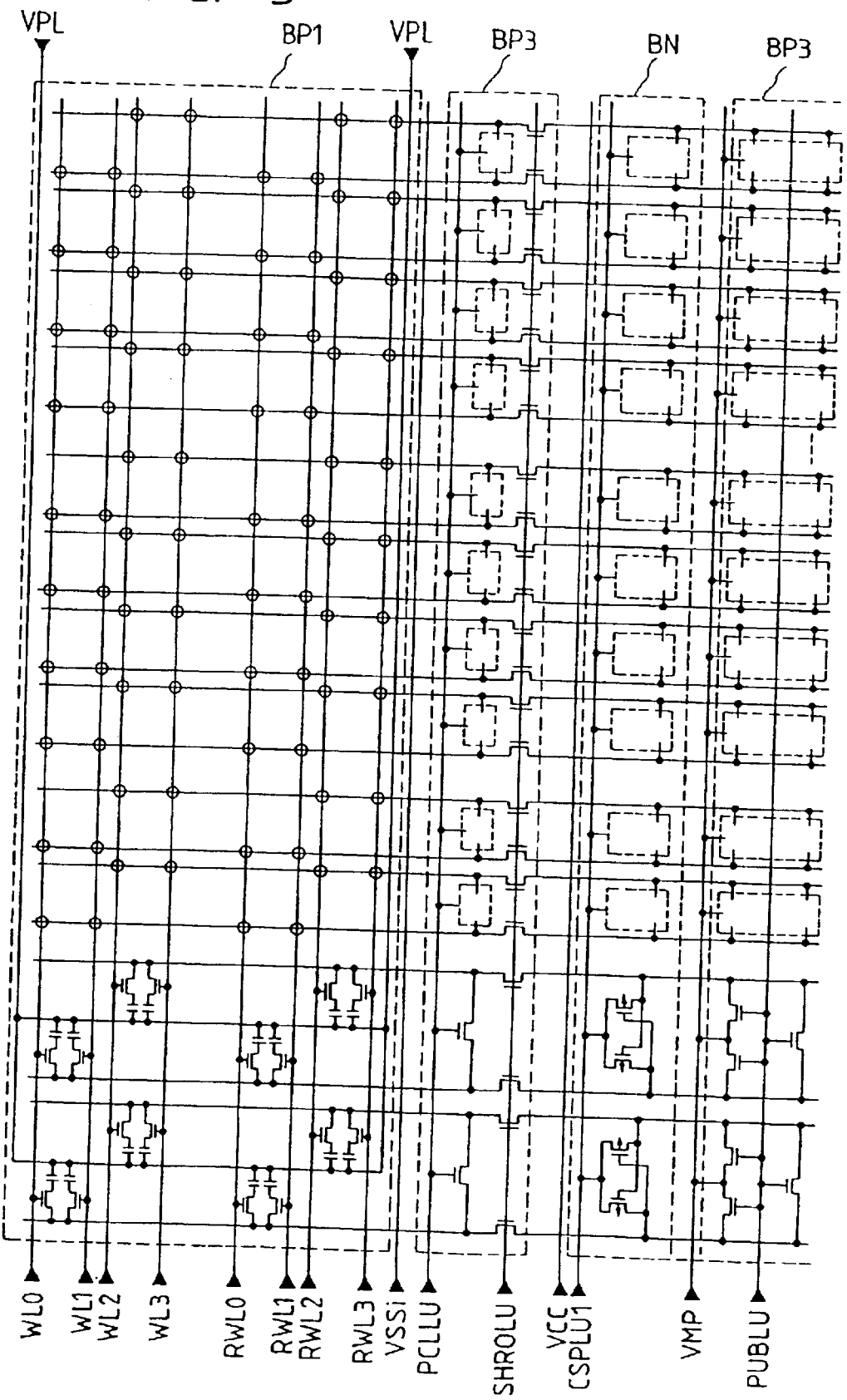
FIG. 5 is a circuit diagram of a portion, showing an example of a memory mat section in the dynamic RAM according to the present invention.
Figure 6:
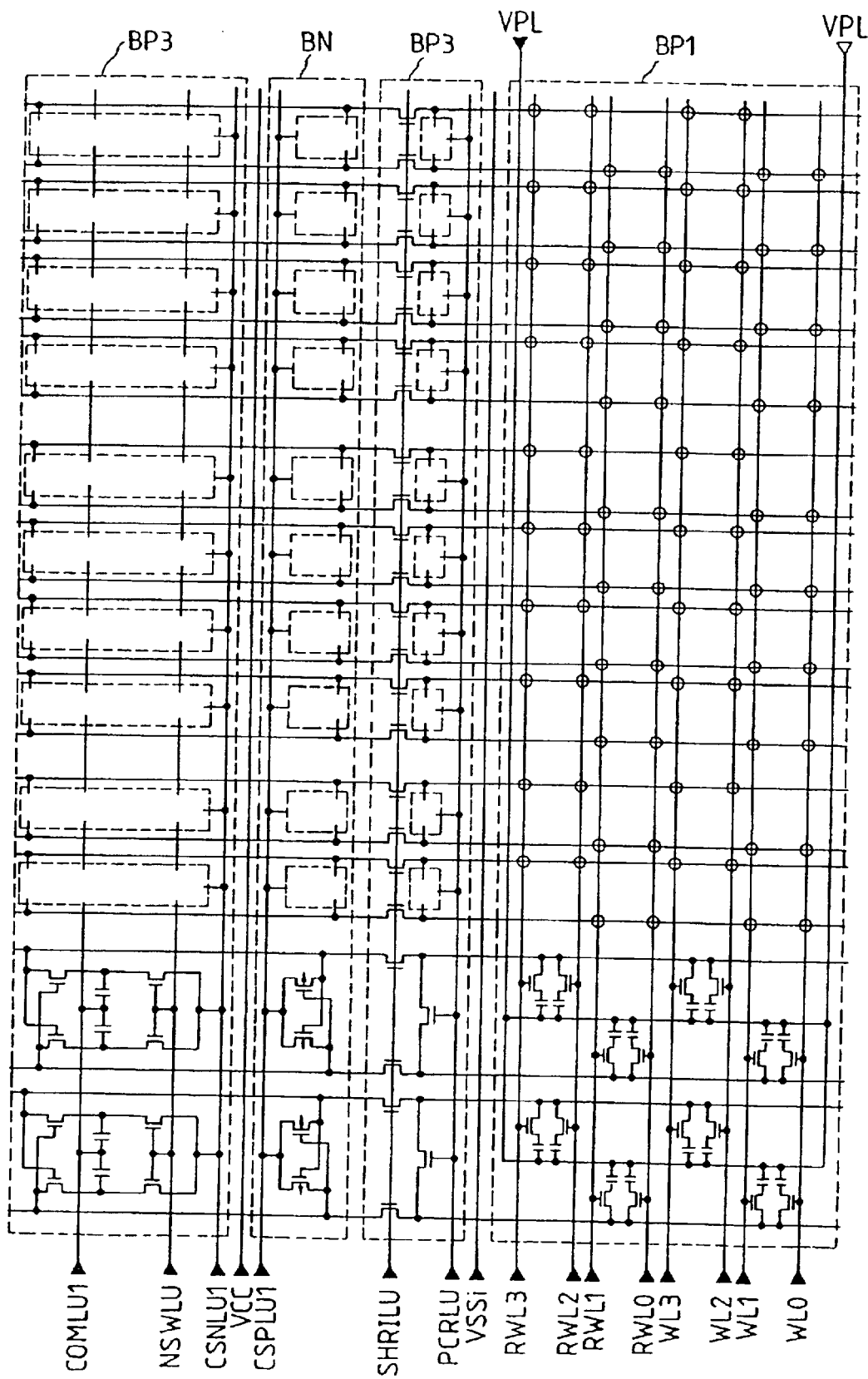
FIG. 6 is a circuit diagram of another portion showing an example of a memory mat section in the dynamic RAM according to the present invention.
Figure 7:
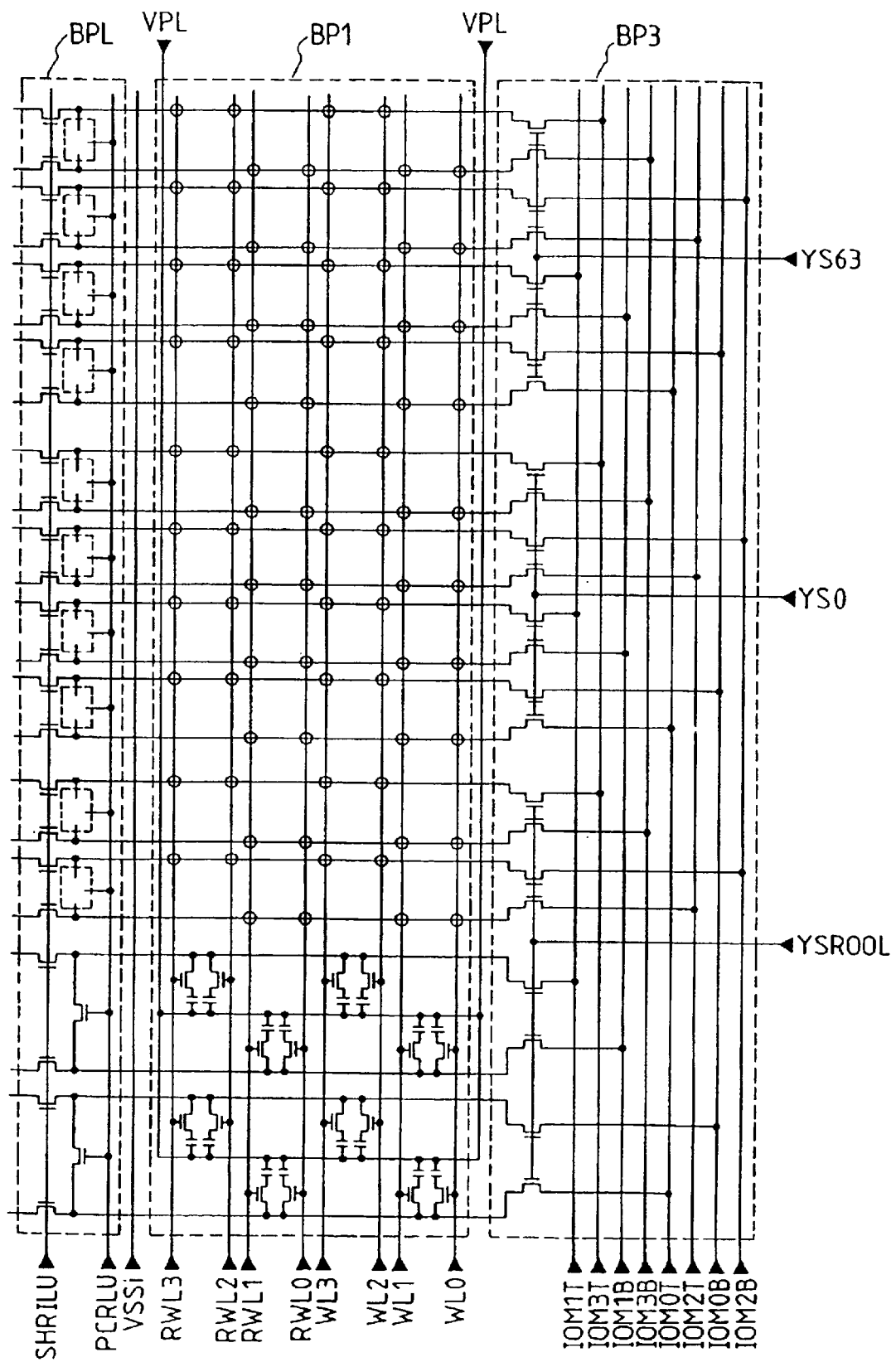
FIG. 7 is another circuit diagram of a remaining portion, showing an example of a memory mat section in the dynamic RAM according to the present invention.

FIGS. 5 to 7 are circuit diagrams showing one embodiment of the memory mat portion in the dynamic RAM according to the present invention. The memory mats of this embodiment are of the aforementioned shared sense amplifier type. Therefore, two memory mats are arranged across the sense amplifiers.

In FIG. 5, there are shown P-channel amplifying MOSFETs constituting sense amplifiers, precharging circuits, and switching MOSFETs connecting sense amplifiers and the data lines of the memory array disposed on the left-hand side of the sense amplifiers. The memory array is formed in the first P-type well region BP1. This first P-type well region is fed with a substrate bias voltage having a small absolute value, such as of −1V, as described above.

The P-channel amplifying MOSFETs constituting the sense amplifiers are formed in the N-type well region BN. The N-channel type switching MOSFETs connecting the data lines of the left-hand memory array and the sense amplifiers, the N-channel type precharging MOSFETs for shorting the data lines and feeding the half precharging voltage, and the N-channel amplifying MOSFETs constituting the sense amplifiers shown in FIG. 6 are formed in the third P-type well region. This third P-type well region is fed with the ground potential of the circuit, as described above.

In FIG. 6, there are shown the aforementioned N-channel type amplifying MOSFETs, the P-channel type amplifying MOSFETs and the N-channel switching MOSFETs connecting the memory array on the right-hand side and the data lines and the sense amplifier. In this embodiment, in order to compensate the input offsets of the sense amplifiers, the sense amplifiers activate the N-channel amplifying MOSFETs at first at the start of its amplification so that the variation of the threshold voltages between the gates and sources of the n-channel amplifying MOSFETs is compensated by making use of the capacitors disposed on the source side.

Specifically, the source potential is lowered to the ground potential through the capacitor thereby to effect the amplification at the first stage. When the amplification signal is amplified, the N-channel MOSFET connected between the source of the amplifying MOSFET and the common source line is turned on to start the ordinary amplifying operation. After this, the P-channel amplifying MOSFET is activated to raise the high level, which has been lowered by the aforementioned amplification of the N-channel amplifying MOSFET, to the power supply voltage level.

The aforementioned P-channel amplifying MOSFET is formed in the N-type well region, and the N-channel switch MOSFET connecting the data lines of the righthand memory array and the sense amplifier is formed in the third P-type well region fed with the ground potential of the circuit. Moreover, the memory array is formed in the first P-type well region. This first P-type well region is fed with the substrate bias voltage such as −1V, as described above.

FIG. 7 shows the aforementioned memory array and the column switch. Like this embodiment, the column switch is disposed at the righthand end portion of the two memory arrays sandwiching the sense amplifier, so that the amplification signal of the lefthand memory array is connected with the input/output lines by using the data lines of the righthand memory array, which is made unselected at that time, as the signal wiring lines. In other words, when the left-hand memory array is read, the right-hand memory array switching MOSFET is turned on after the sense amplifier is activated, and the transmission is made to the aforementioned input/output lines by making use of the data lines as the signal lines. In reading the right-hand memory array, the transmission is made to the input/output lines through the column switch MOSFET where its data line signal is selected. The aforementioned column switch is composed the N-channel MOSFETs. These column switch MOSFETs are formed in the third P-type well region and fed with the bias voltage such as the ground potential of the circuit.

Figure 8:
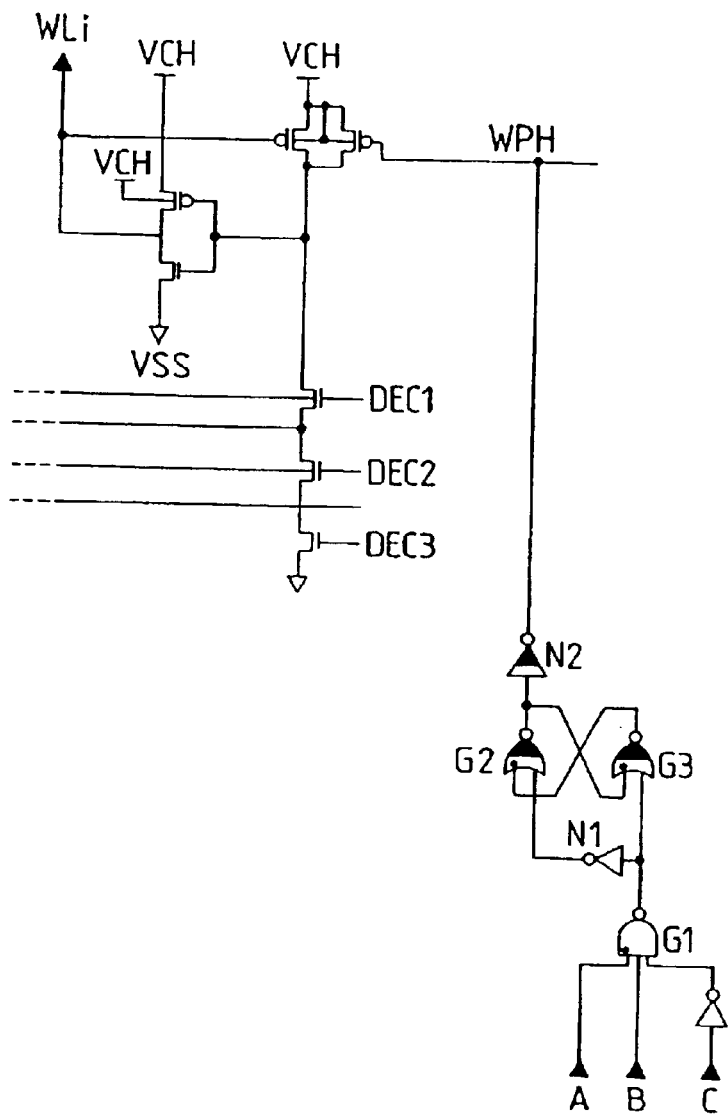
FIG. 8 is a circuit diagram showing an example of a word driver in the dynamic RAM according to the present invention.

FIG. 8 is a circuit diagram showing one embodiment of the word driver. The potential of the word driver needs to be made higher by the threshold voltage of the MOSFET for selecting the address of the memory cell than the operating voltage of the sense amplifier so as to perform the full write of the storage capacitor. Hence, the operating voltage is set to a boosted voltage such as the VCH. On the other hand, the decoder or the like has to be subjected to level transformation because the internal limited voltage is used.

In this embodiment, the signals A to C are decoded by the gate circuit G1 to generate the memory array selecting signal. Since this signal is lower than the boosted voltage VCH, as described above, a level-changed signal WPH is produced by the gate circuits G2 and G3 in the form of a latch operated on the boosted voltage VCH and the inverter circuit N2.

In the selected memory array, the signal WPH goes to the high level VCH to turn off the P-channel MOSFETs. All the N-channel MOSFETs which receive the decoder outputs DEC1 to DEC3 are turned on to produce the selecting signal at the low level. As a result, the P-channel MOSFETs constituting the word driver are turned on to raise the level of the word line WLi to the high level VCH. The P-channel MOSFETs which receive the word line WLi are P-channel MOSFETs for feedback, and their conductances are small, so that the input signal of the word driver is set to the low level by the aforementioned decoder outputs DEC1 to DEC3.

For the unselected word lines, the feedback P-channel MOSFETs for feedback which receive the low level of the word lines are on to fix the input signal of the word driver to the VCH. In the unselected memory array, the signal WPH is at the low level to fix the input of the word driver to a high level, e.g., VCH.

In this peripheral circuit, the N-type well region BN provided with the P-channel MOSFETs for outputting the signal at the high voltage level VCH is fed with the corresponding high voltage VCH. In short, as shown in FIG. 3, the N-type well region is fed with the bias voltage such as VCC/VCH according to the operating voltage which is fed to the sources of the P-channel MOSFETs formed in the N-type well region.

Figure 9:
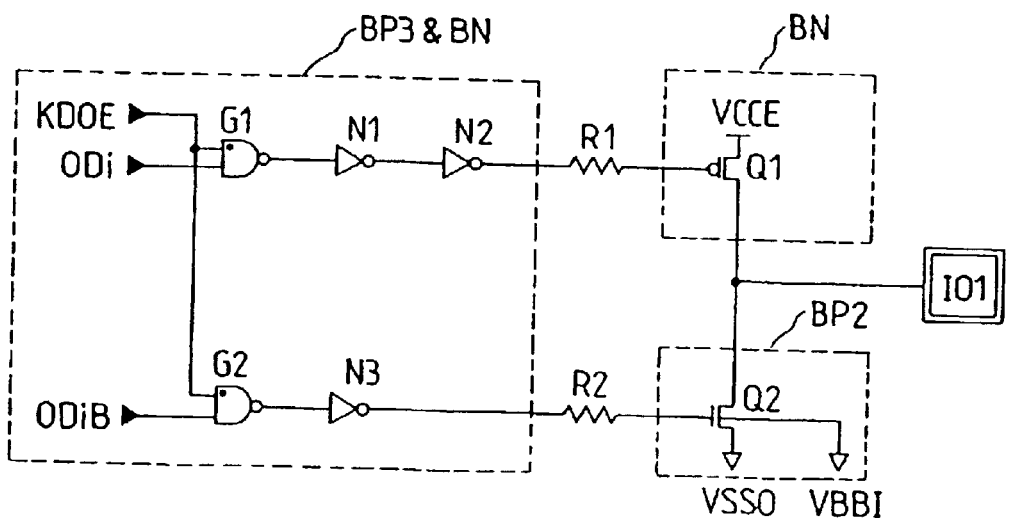
FIG. 9 is a circuit diagram showing an example of the output buffer in the dynamic RAM according to the present invention.

FIG. 9 is a circuit diagram showing one embodiment of the output buffer. This output buffer is made up of an output control circuit and an output circuit. The output circuit comprising a CMOS circuit including a P-channel output MOSFET Q1 and an N-channel output MOSFET Q2. The output control circuit comprising gate circuits G1 and G2, inverter circuits N1 to N3 and resistors R1 and R2.

The N-channel output MOSFET Q2 is formed in the second P-type well region BP2 and is fed with the substrate bias voltage VBB1 such as of −2V so that the drain of the output MOSFET Q2 and the second P-type well region may not be forward biased by the undershoot transmitted from the external terminal IO1. The P-channel output MOSFET Q1 is formed in the N-type well region, and the source is fed with the power supply voltage VCCE. Although not shown, therefore, the N-type well region is fed with the power supply voltage VCCE as the bias voltage.

On the contrary, the N-channel MOSFETs constituting the gate circuits G1 and G2 and the inverters N1 to N3 constituting a control circuit are formed in the third P-type well region, and are fed with the ground potential of the aforementioned circuit as the bias voltage. Incidentally, the P-channel MOSFETs constituting the control circuit are is formed in the N-type well region and are fed with the power supply voltage corresponding to the operating voltage as the bias voltage.

Figure 10:
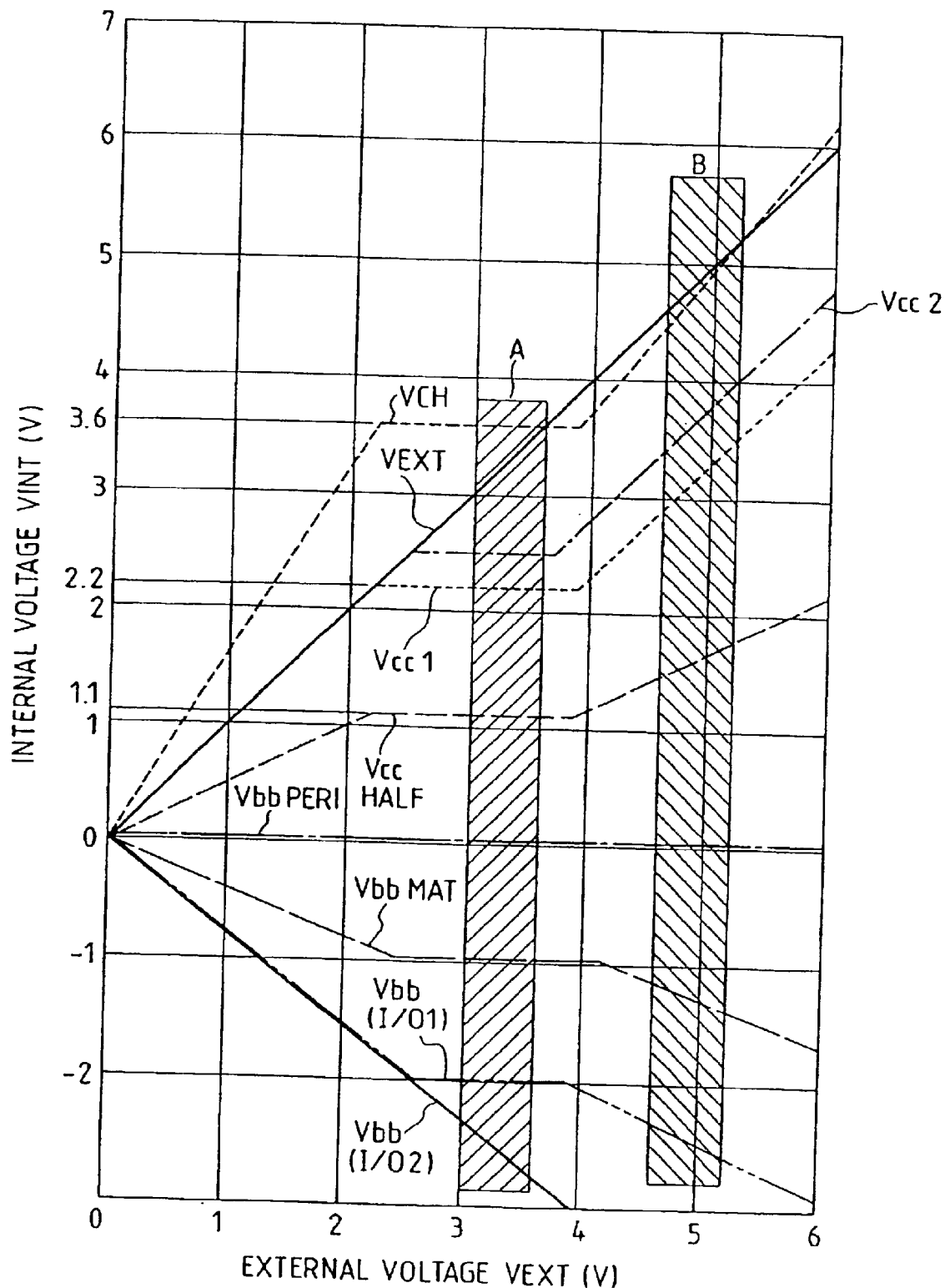
FIG. 10 is a characteristic diagram representing the relations between external voltage and internal voltage, showing an example of the dynamic RAM according to the present invention.

FIG. 10 is a characteristic diagram illustrating the relations between the external voltages and the internal voltages of one embodiment of the dynamic RAM according to the present invention. In this embodiment, from the external terminal, an external power supply voltage Vext of about 3.3V is supplied. For this external power supply voltage Vext of 3.3V, the internal voltage is made constant for the operations in the hatched region A. In other words, the substrate voltage Vbbmat of the memory array is stabilized to about −1V even if the external power supply voltage Vext fluctuates within an allowable range around 3.3V. The input/output section may be stabilized to VbbI/01 of about −2V or may be changed depending on the external power supply voltage of VbbI/02.

In order to make efficient the acceleration test for the burn-in (or aging) test, the internal voltage is raised according to the rise in the power supply voltages when the power supply voltage VCC1 is raised above the ordinary allowable range. Specifically, if the power supply voltage for the burn-in test is set to a value in the hatched region B, the internal voltage is accordingly raised.

The voltage VCH is a boosted voltage at which the word lines is selected. The voltage Vcc1 is an (internal) power supply voltage, and the voltage Vcc2 is also an (internal) power supply voltage but higher than the voltage Vcc1. If these two kinds of internal power supply voltages are thus prepared, the voltage Vcc2 can be used in place of the voltage Vcc1 in the circuit which is required to have a high speed operation or a noise resistance. The voltage Vcchalf if an internal voltage half level of the power supply voltage Vcc1 and is used as the plate voltage of the memory cells. The voltage Vbbperi is a voltage fed to the P-well of the peripheral circuit (or first circuit portion). The voltage Vbbmat is a voltage fed to the P-well of the memory mats. The voltage VbbI/01 or VbbI/02 is a voltage fed to the P-well of the input/output circuit (or second circuit portion).

Figure 11:
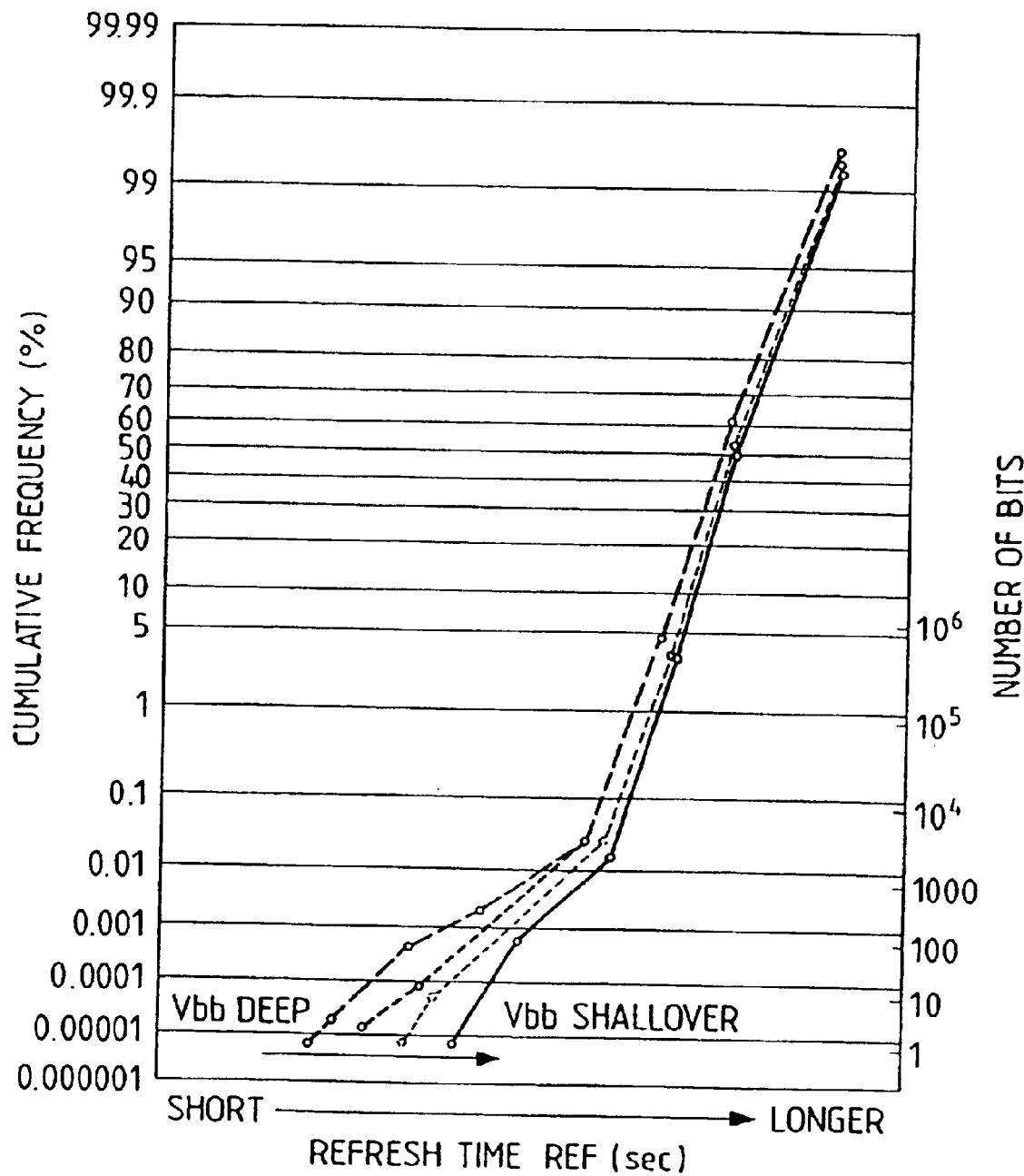
FIG. 11 is a refresh characteristic diagram for explaining the present invention.

FIG. 11 is a refresh characteristic diagram for explaining the present invention. The refresh period has to be determined in conformity with the cell having the worst refresh characteristics out of a large number of memory cells of about 16 Mbits or 64 Mbits. It will be understood from FIG. 11 that the refresh time tREF necessarily becomes longer as the substrate bias voltage Vbb is made shallower.

Even in the memory cells having identical characteristic, as the absolute value of the aforementioned substrate bias voltage is made smaller, the voltage applied between the source/drain connected with the capacitor of the memory cell and the substrate becomes lower to reduce the leakage current accordingly. This is because, as the storage capacity is increased to about 16 Mbits or 64 Mbits, the capacitance of the storage capacity becomes smaller, and hence the aforementioned leakage current cannot be ignored. In a dynamic RAM having such a large storage capacity, it is almost impossible to uniform the characteristics of all the memory cells. Some memory cells of one or several bits may have a short refresh time to accordingly increase the consumption current for setting the refresh period.

With the structure according to the present invention, in which the substrate bias voltage is set to the necessary minimum to lower the voltage between the source/drain connected with the capacitors of the memory cells and the substrate thereby to reduce the leakage current, the refresh period of the dynamic RAM having a large storage capacity can be drastically elongated to reduce the power consumption accordingly.

The following operations and effects are achieved by the embodiments thus far described.

(1) The P-type well portion where formed are the memory mats having the dynamic memory cells arranged in a matrix is fed with the back bias voltage which is set to the voltage having a small absolute value optimized for the refresh characteristics; the P-type well portion where formed are the N-channel MOSFETs of the input circuit or output circuit connected with the external terminals is fed with the back bias voltage which is set to the voltage having a large absolute value considering the undershoot voltage. As a result, there is achieved an effect that the P-type well region provided with the input circuit or output circuit corresponding to the external terminals can be protected against the understood while reducing the leakage current to improve the refresh characteristics.

(2) The N-channel MOSFETs other than the N-channel MOSFETs of the memory mats and the input circuit or the output circuit are formed in the second P-type well region and are fed with the ground potential of the circuit. Consequently, there is produced an effect that the speed of the operation can be increased even at a low voltage.

(3) The first back bias voltage fed to the first P-type well region is produced by the charge pump circuit using the pulse signal which is produced by the internal voltage which is made constant. Hence there is achieved an effect that the substrate bias voltage can be made constant.

Although our invention has been specifically described in connection with its embodiments, it should not be limited thereto but can naturally be modified in various manners without departing from the gist thereof. For example, the layout of the dynamic RAM is not limited to that of the embodiment of FIG. 1 but can take a variety of modes. Likewise, the substrate bias generator or other internal circuits can take a variety of modes. The bias voltage may be produced by the internal circuit but can be fed, if necessary, from the outside. The P-type well region in which the peripheral circuit is formed is fed with the ground potential of the circuit, as described above, but may be fed with the same bias voltage as that of the memory array or the input/output circuit.

The present invention can be broadly applied to not only dynamic RAMs but also a semiconductor integrated circuit devices such as a digital integrated circuit which is composed of memory mats having dynamic memory cells arranged in a matrix.

The effects produced by the representative of the invention disclosed herein will be briefly described in the following. The P-type well portion where formed are the memory mats having the dynamic memory cells arranged in a matrix is fed with the back bias voltage which is set to the voltage having a small absolute value optimized for the refresh characteristics, and the P-type well portion where formed are the N-channel MOSFETs of the input circuit or output circuit connected with the external terminals is fed with the back bias voltage which is set to the voltage having a large absolute value considering the undershoot voltage. As a result, the P-type well region provided with the input circuit or output circuit corresponding to the external terminals can be protected against the undershoot while reducing the leakage current to improve the refresh characteristics.

In the second P-type well region, the N-channel MOSFETs other than the N-channel MOSFETs of the memory mats and the input circuit or the output circuit are formed and are fed with the ground potential of the circuit, so that the speed of the operation can be increased even at a low voltage.

The first back bias voltage fed to the first P-type well region is produced by the charge pump circuit using the pulse signal which is produced by the internal voltage which is made constant, and hence the substrate bias voltage can be made constant.

What is claimed is:

1. A semiconductor device comprising:
an input terminal to receive an external voltage; and
a voltage formation circuit to provide an internal voltage based on said external voltage,
wherein said internal voltage has a first change rate in accordance with a change of said external voltage, when said external voltage is in a first voltage range,
wherein said internal voltage has a second change rate in accordance with the change of said external voltage, when said external voltage is in a second voltage range, said second change rate being different from said first change rate, and
wherein said second voltage range is larger than said first voltage range.

2. A semiconductor device according to claim 1,
wherein said internal voltage has a third change rate in accordance with the change of said external voltage, when said external voltage is in a third voltage range, said third change rate being different from said second change rate, and
wherein said third voltage range is larger than said second voltage range.

3. A semiconductor device according to claim 2,
wherein said first voltage range and said second voltage range are successive ranges, and
wherein said second voltage range and said third voltage range are successive ranges.

4. A semiconductor device according to claim 2,
wherein said external voltage of said second voltage range is applied in a normal operation of said semiconductor device, and
wherein said external voltage of said third voltage range is applied in a test operation of said semiconductor device.

5. A semiconductor device according to claim 4,
wherein said test operation is a burn-in test operation.

6. A semiconductor device according to claim 2,
wherein said second change rate is substantially 0.

7. A semiconductor device according to claim 2,
wherein said first change rate is different from said third change rate.

8. A semiconductor device according to claim 2,
wherein said first change rate is the same as said third change rate.

9. A semiconductor device according to claim 2,
wherein said internal voltage is applied to a P type well region of a semiconductor substrate of said semiconductor device.

10. A semiconductor device comprising:

an input terminal to receive an external voltage; and a voltage generation circuit to provide an internal voltage based on said external voltage, said internal voltage being a negative voltage, wherein the absolute value of a change of said internal voltage in accordance with a change of said external voltage is a first value, when said external voltage is in a first voltage range, wherein the absolute value of the change of said internal voltage in accordance with the change of said external voltage is a second value, when said external voltage is in a second voltage range, said second value being smaller than said first value, wherein the absolute value of the change of said internal voltage in accordance with the change of said external voltage is a third value, when said external voltage is in a third voltage range, said third value being larger than said second value, wherein said second voltage range is larger than said first voltage range, and wherein said third voltage range is larger than said second voltage range.

11. A semiconductor device according to claim 10, wherein said first voltage range and said second voltage range are successive ranges, and wherein said second voltage range and said third voltage range are successive ranges.

12. A semiconductor device according to claim 10, wherein said external voltage of said second voltage range is applied in a normal operation of said semiconductor device, and wherein said external voltage of said third voltage range is applied in a test operation of said semiconductor device.

13. A semiconductor device according to claim 12, wherein said test operation is a burn-in test operation.

14. A semiconductor device according to claim 10, wherein said second value is substantially 0.

15. A semiconductor device according to claim 10, wherein said first change rate is different from said third change rate.

16. A semiconductor device according to claim 10, wherein said first change rate is the same as said third change rate.

17. A semiconductor device according to claim 10, wherein said internal voltage is applied to a P type well region of a semiconductor substrate of said semiconductor device.

18. A semiconductor device comprising:

an input terminal to receive an external voltage; and a voltage generation circuit to provide an internal voltage in accordance with said external voltage, said internal voltage being a negative voltage, wherein the absolute value of the change of said internal voltage in accordance with a change of said external voltage is a first value, when said external voltage is in a first voltage range, wherein the absolute value of the change of said internal voltage in accordance with the change of said external voltage is a second value, when said external voltage is in a second voltage range, said second value being larger than said first value, wherein said second voltage range is larger than said first voltage range, and wherein said external voltage of said first voltage range is applied in a normal operation of said semiconductor device.

19. A semiconductor device according to claim 18, wherein said first voltage range and said second voltage range are successive ranges.

20. A semiconductor device according to claim 18, wherein said external voltage of said second voltage range is applied in a burn-in test operation of said semiconductor device.

21. A semiconductor device according to claim 18, further comprising:

a plurality of memory cells each of which comprises a N-channel transistor having source and drain regions formed in a P type well region, wherein said internal voltage is applied to said P type well region formed in a semiconductor substrate of said semiconductor device.

* * * * *